(12) United States Patent  (10) Patent No.: US 6,225,848 B1
Tilley et al.  (45) Date of Patent: May 1, 2001

(54) METHOD AND APPARATUS FOR SETTLING AND MAINTAINING A DC OFFSET

(75) Inventors: Keith A. Tilley, Round Rock, TX (US); Raul Salvi; Enrique Ferrer, both of Miami, FL (US); Atif A. Meraj, Plantation, FL (US); David J. Graham, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,286

(22) Filed: Feb. 29, 2000

Related U.S. Application Data

(63) Continuation-in-part of application No. 09/290,564, filed on Apr. 13, 1999.

(51) Int. Cl.[7] .................................................... H03K 5/08
(52) U.S. Cl. ................. 327/307; 327/362; 330/9
(58) Field of Search ..................... 327/307, 318, 327/362, 378; 330/9, 254, 260

(56) References Cited

U.S. PATENT DOCUMENTS

| | | | |
|---|---|---|---|
| 4,653,117 | 3/1987 | Heck | 455/209 |
| 5,079,526 | 1/1992 | Heck | 332/127 |
| 5,483,691 | 1/1996 | Heck et al. | 455/234.2 |
| 5,539,779 | * 7/1996 | Nagahori | 327/307 |
| 5,584,059 | 12/1996 | Turney et al. | 455/126 |
| 5,617,473 | 4/1997 | Wietecha et al. | 379/399 |
| 5,789,974 | 8/1998 | Ferguson, Jr. et al. | 330/2 |
| 5,893,029 | 4/1999 | Bastani | 455/324 |
| 6,006,079 | 12/1999 | Jaffee et al. | 455/310 |

* cited by examiner

Primary Examiner—Kenneth B. Wells
(74) Attorney, Agent, or Firm—James A. Lamb; Barbara R. Doutre

(57) ABSTRACT

A DC offset correction loop (200) utilizes a sign bit generator (204), binary search stage (206), and a digital-to-analog converter (208) in its feedback path to correct for DC offsets at the input of a gain stage (202). When a correction value is obtained, it is applied and held (524) to compensate for the DC offset. When a programming event occurs (534), such as detecting an increase in DC offset beyond a threshold, detecting a significant temperature change, or passage of time, a new DC offset correction cycle is initiated.

20 Claims, 5 Drawing Sheets

METHOD AND APPARATUS FOR SETTLING AND MAINTAINING A DC OFFSET

CROSS REFERENCE TO RELATED APPLICATIONS

This application is a continuation-in-part of pending application Ser. No. 09/290,564 filed Apr. 13, 1999, Tilley, et al., entitled "Method and Apparatus for Settling a DC Offset," assigned to Motorola, Inc., and is related to patent applications Docket No. CM03101J by Charles R. Ruelke, entitled "DC Offset Correction Loop for Radio Receiver," Docket Number CM03133J by Tilley, et al., entitled "Enhanced DC Offset Correction Through Bandwidth and Clock Speed Selection," and Docket No. CM03141J by Ferrer, et al., entitled "DC Offset Correction Adaptable to Multiple Requirements," filed concurrently herewith, assigned to Motorola, Inc., and incorporated herein by reference.

TECHNICAL FIELD

This invention relates to techniques and apparatus for minimizing DC offsets in electronic circuits.

BACKGROUND

FIG. 1 is a block diagram of a traditional analog DC offset correction loop 100 such as would be used around the baseband path of a direct conversion receiver or zero IF receiver of a radio, cell phone, or other communication device. Correction loop 100 is used for single ended applications and generally includes a baseband filter 102, an integrator 104, an operational transconductance amplifier (OTA) 106, and a mixer 108 whose output impedance and DC bias current are represented by a current source 110 and a resistor 112. The desired DC voltage at the output of the baseband filter 102 is analog ground, Vag, however, the interaction of the current source 110, resistor 112, and the input referred DC offset of the baseband filter 102 generates an undesired DC offset at the filter input. The DC offset at the input of the baseband filter 102 is amplified through the baseband filter and produces a large offset at the baseband filter output. The integrator 104 and OTA 106 provide a feedback path to alter the current through the resistor 112 to adjust the voltage presented to the input of the baseband filter 102 thereby reducing the input referred DC offset.

Modern communications systems often require fast settling times. Even small DC offsets can saturate the signal path (e.g. baseband filters) causing all linear loop equations to be invalid making it very difficult to settle the loop within the allotted time. Once the offset has been corrected, the correction loop must be moved to a much lower corner frequency (i.e., narrowed greatly) or opened completely. Making a transition from a very wide offset correction loop bandwidth to a very narrow bandwidth poses a problem due to the transient response produced when making such a large transition. Opening the loop in an analog DC offset loop causes the correction voltage to drift from the desired value due to leakage on the integrator's 104 capacitor.

Accordingly, there is a need for an improved method and apparatus for correcting DC offsets, particularly those offsets which occur in zero IF and direct conversion receivers and transmitters.

DETAILED DESCRIPTION OF THE PREFERRED EMBODIMENTS

Figure 1:
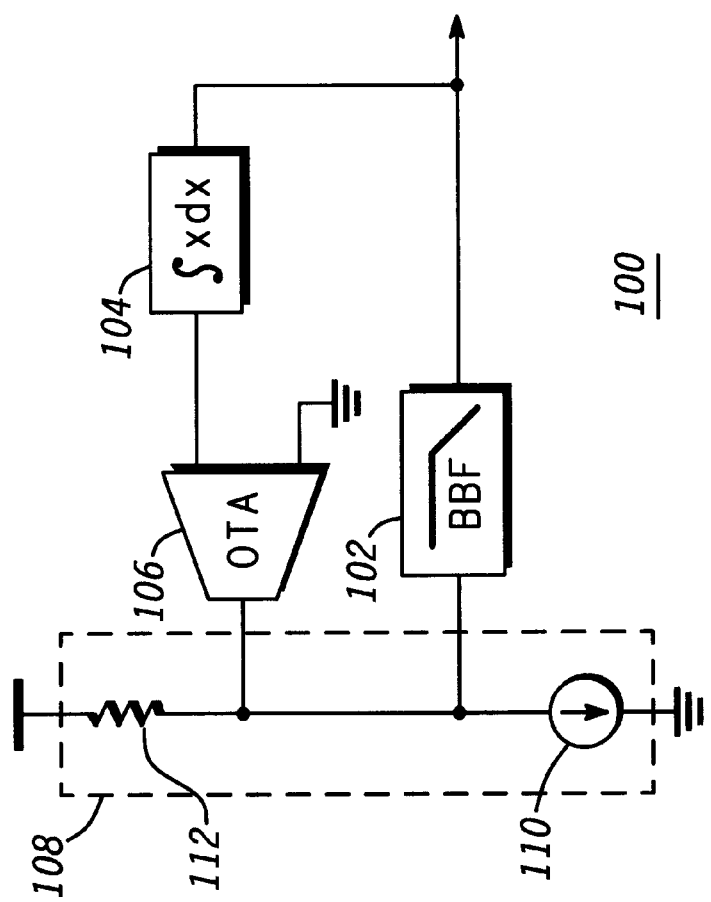
FIG. 1 is a block diagram of a prior art DC offset correction loop.

While the specification concludes with claims defining the features of the invention that are regarded as novel, it is believed that the invention will be better understood from a consideration of the following description in conjunction with the drawing figures.

Briefly, the DC offset correction loop of a first aspect of the present invention incorporates a sign bit controlled binary search stage in combination with a digital-to-analog converter to correct for DC offsets in electronic circuits. In another aspect of the present invention, after an initial correction is completed, the correction is maintained at a specified level until a program event triggers a repeating of the correction process. An appropriate program event might include a change in DC offset, temperature, humidity, time lapse or supply voltage.

Figure 2:
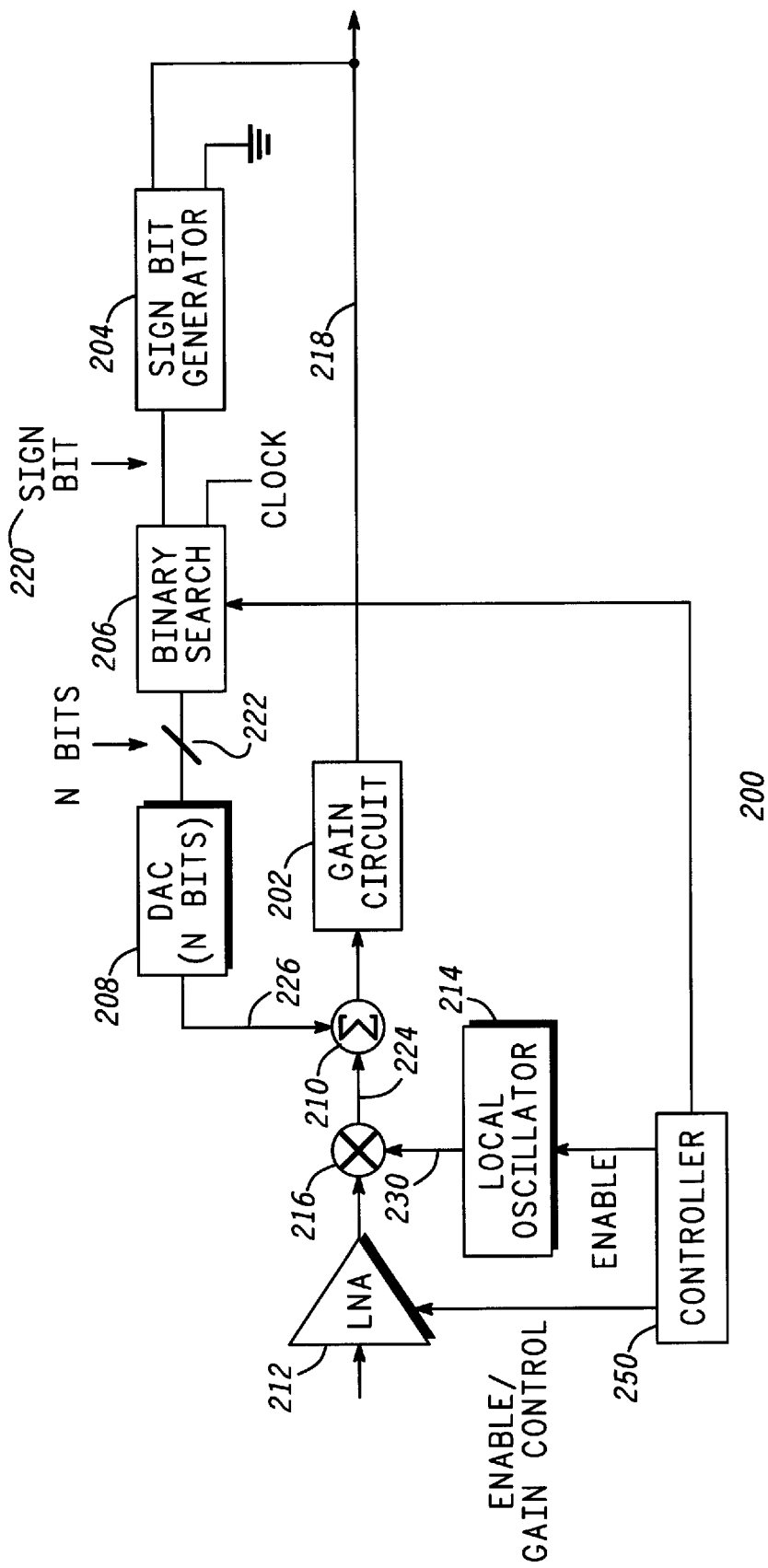
FIG. 2 is a block diagram of a DC offset correction loop in accordance with the present invention.

FIG. 2 is a block diagram of a DC offset correction loop 200 in accordance with the preferred embodiment of the present invention. Offset correction loop 200 includes a gain stage 202, a sign bit generator 204, a binary search stage 206, a digital-to-analog converter (DAC) 208, and a summer 210. In the case of a direct conversion receiver or Zero IF receiver, a Low Noise Amplifier 212's output (or the output of an IF amplifier) and an injection signal output 230 of a local oscillator 214 are generally mixed at mixer 216 to produce the baseband signal at the output 224 of mixer 216. The gain stage 202 may be implemented using a variety of gain devices, such as a baseband filter or an amplifier. The sign bit generator 204 may be implemented through a variety of devices, such as a comparator, a limiter, an analog-to digital converter (ADC), or similar device. In accordance with this embodiment of the invention, the sign bit controlled binary search means 206 is incorporated into the feedback path to provide improved DC offset correction. The binary search stage 206 provides a binary search means which may be implemented in software, using known binary search algorithms, or hardware, using adders and registers.

In operation, with no input signal present other than a DC offset at the input 224 to summer 210, there will be a DC offset at the input of the gain stage 202 for which a correction is desired. The condition of no input signal at 224 can be achieved by disabling the low noise amplifier (or IF amplifier) 212 or decreasing its gain to approximately zero (e.g. via an automatic gain control circuit (not shown)). Equivalently, the local injection oscillator 214 can be disabled to produce no local oscillator injection signal to the mixer 216 at 230. In either case, no output other than the DC offset is present at the output 224 of the mixer 216. The gain stage 202 amplifies this DC offset and produces an amplified DC offset 218.

The amplified DC offset 218 is fed back to the sign bit generator 204 where it gets converted to a positive or negative sign bit 220. In accordance with the present embodiment of the binary search, the sign bit 220 is used as an input to the binary search stage 206 to determine which direction to move the offset correction. The binary search stage 206 takes the sign bit 220 and a clock input and produces a bit string 222 to step the DAC 208. Each time the DAC 208 is stepped, a new correction voltage 226 is generated which is fed back to the summer 210 and used to correct the DC offset present at the input to the gain stage 202.

In accordance with the present embodiment of the binary search, the only information being fed back to the binary search stage 206 is the direction with which to correct the offset. The binary search stage 206 uses the sign bit 220 to step the DAC 208 through a binary search of DAC settings, taking one step for each adjusted DC offset, until the DAC has been stepped to its least significant bit thereby providing a final correction voltage. Thus, the offset correction loop 200 is able to determine an appropriate DAC setting in the minimum amount of time.

For a binary algorithm, operation preferably begins at a predetermined DAC setting of $2^N/2$, where N represents the number of bits of resolution used in the DAC 208. The direction of each DAC step is based on the sign bit 220. The initial step of the DAC will be $2^N/2^2$. The steps will then become incrementally smaller each time according to the pattern $2^N/2^2, 2^N/2^3, 2^N/2^4 \ldots 2^N/2^N$. When the DAC steps $2^N/2^N$, the least significant bit (LSB) will have been adjusted, and the search is complete. For some applications, other start points may be desired. The binary search stage 206 steps the DAC 208 up or down using incrementally smaller steps until the LSB is achieved. For each transition coming through the DAC 208 the bit settings change and this change in bit settings changes the output of the DAC 208. The changes in the output of the DAC 208 are presented to the summer 210 to offset the input to the gain stage 202. The DC offset is adjusted through each step, which in turn adjusts the sign bit as necessary. Once the final step has been reached, the DAC setting is held constant until another correction sequence is initiated, as will be described later.

The following method can be used to describe the DC offset correction technique in accordance with the binary search technique of the present invention. The technique is initialized by setting the DAC 208 to a predetermined setting. Next, the DC offset present at the gain stage input is amplified and produces an amplified DC offset. Then, in accordance with the present invention, the steps of generating a sign bit based on the amplified DC offset, stepping the DAC by a predetermined amount in a direction indicated by the sign bit, and generating an analog voltage in response to the stepped DAC, are executed. The final step includes correcting the DC offset at the input of the gain stage in response to the analog voltage, and repeating the steps of amplifying through correcting until the least significant bit (LSB) of the DAC has been adjusted. Further steps include maintaining the DAC setting until a new programming event occurs, and re-initiating the search in response to the new programming event.

For this search technique, N-1 clock cycles are used, where N is the number of DAC bits. Upon completion of the search, the DAC setting is preferably held until the entire procedure is re-initiated by a programming event. The clock rate of the correction loop 200 is preferably selected such that the output of the gain stage 202 settles before another change in the DAC 208 is attempted.

Figure 3:
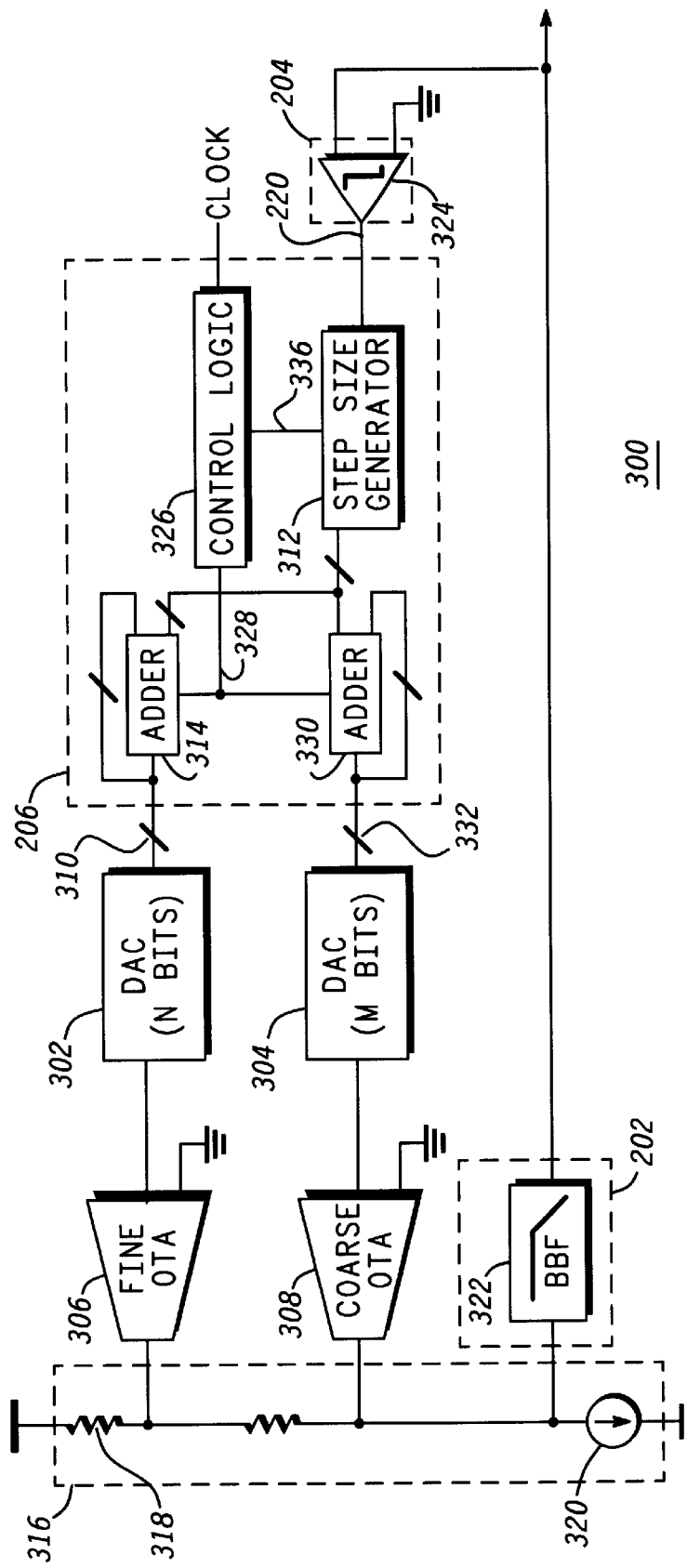
FIG. 3 is a block diagram showing the DC offset correction loop of the present invention including coarse and fine tuning adjusters.

Increased precision may be obtained through the use of additional DACs and OTAS. FIG. 3 shows a simplified block diagram of a DC offset correction loop 300 formed in accordance with the binary search method and apparatus of the present invention and implemented in a system having both coarse and fine tuning. Like numerals have been carried forward where applicable. DC offset correction loop 300 includes the gain stage 202 being implemented as a baseband filter 322, and the sign bit generator 204 being implemented as a comparator 324. The binary search stage 206 is shown implemented using control logic 326 which controls, via control lines 328, 336 a step size generator 312 and two adders 314, 330. The two adders 314, 330 generate separate bit strings 310, 332. The offset correction loop 300 further includes two DACs 302, 304 and two operational transconductance amplifiers 306, 308. DAC 302 and OTA 306 provide fine tuning adjustment while DAC 304 and OTA 308 provide coarse tuning adjustment to the offset correction loop 300. The outputs of the OTAs 306, 308 are coupled to a receiver device 316 whose output impedance and DC bias current are represented by resistors 318 and current source 320.

In accordance with the binary search technique of the present invention binary search stage 206 generates a first bit string 332 for coarse tuning the loop 300 while the fine tuning correction value at the output of the second OTA 306 is held without correction (at zero). The coarse adjustment begins at the predetermined setting of the first DAC 304, preferably $2^N/2$. The coarse adjustment of loop 300 is performed by stepping the first DAC 304 through a predetermined number of successively smaller steps with the sign of each step being controlled by the sign bit 220. Once the coarse tuning is completed, the coarse correction value is held constant at the output of the first OTA 308 while another binary search is performed using the second DAC 302 and second OTA 306 for fine adjustment via bit string 310.

For example, if first DAC 304 coarse tunes using 6 bits and the second DAC 302 fine tunes using 7 bits, for a total of 13 bits of resolution, then the DC correction loop corrects in:

(6−1)+(7−1)=11 clock cycles.

As another binary search alternative, the binary search stage 206 can tune the first DAC 304 by incrementally stepping the first DAC in the direction indicated by the sign bit until the DC offset has been overcorrected (i.e. until the sign bit changes). The first DAC 304 is then decremented by one step in response to the loop 300 being overcorrected. The loop 300 is then fine tuned by incrementally stepping the second DAC 302 in the direction indicated by the sign bit until the offset is overcorrected again.

Figure 4:
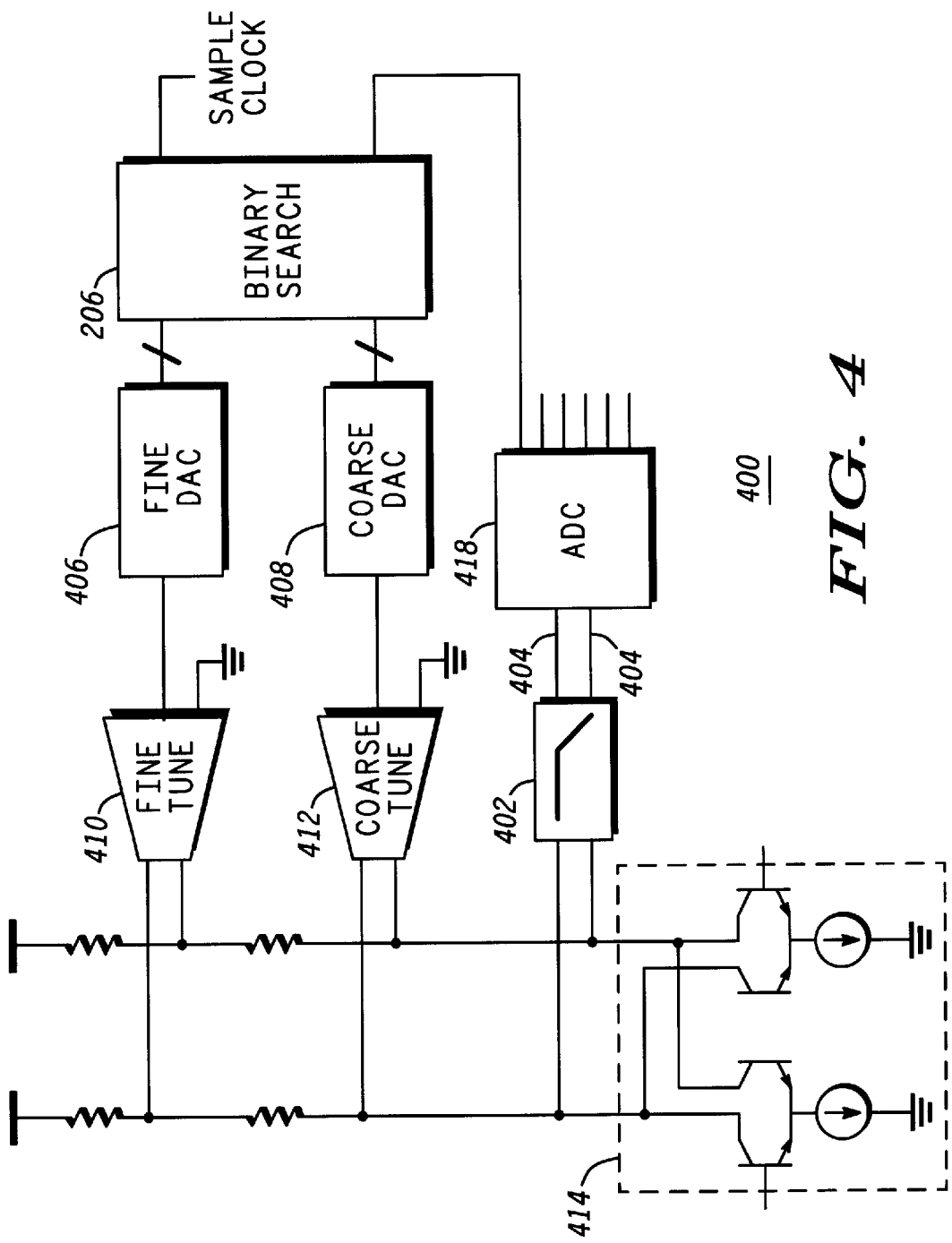
FIG. 4 is a block diagram of the DC offset correction loop of the present invention implemented in a differential system with coarse and fine tuning.

The DC offset correction loop of the present invention has applications in differential systems as well as single ended systems. FIG. 4 is a simplified block diagram of a DC offset correction loop 400 formed in accordance with the present invention and implemented in a differential system. System 400 includes a mixer 414 feeding into a gain stage formed of a baseband filter 402. Because the entire system 400 is differential, any differential offset gets amplified through the baseband filter 402 producing large undesired differential offsets at the outputs 404. In this embodiment of the invention, the sign bit generator is shown implemented using an ADC 418. Again, the binary search stage 206 is included in the feedback path in accordance with the invention and can be implemented using software or hardware as previously described. Both coarse and fine tuning are provided, if desired, through the use of DACs 406, 408 and OTAs 410, 412.

The range of possible correction values and the minimum resulting offset which can be achieved using the offset correction loop of the present invention are functions of the number of DAC bits, LSB step size of the DAC, gain through the OTA(s) and their load(s), as well as the gain stage's gain. The DC offset correction loop of the present invention is particularly well suited to reliably meet the stringent timing requirements for today's communication standards.

Figure 5:
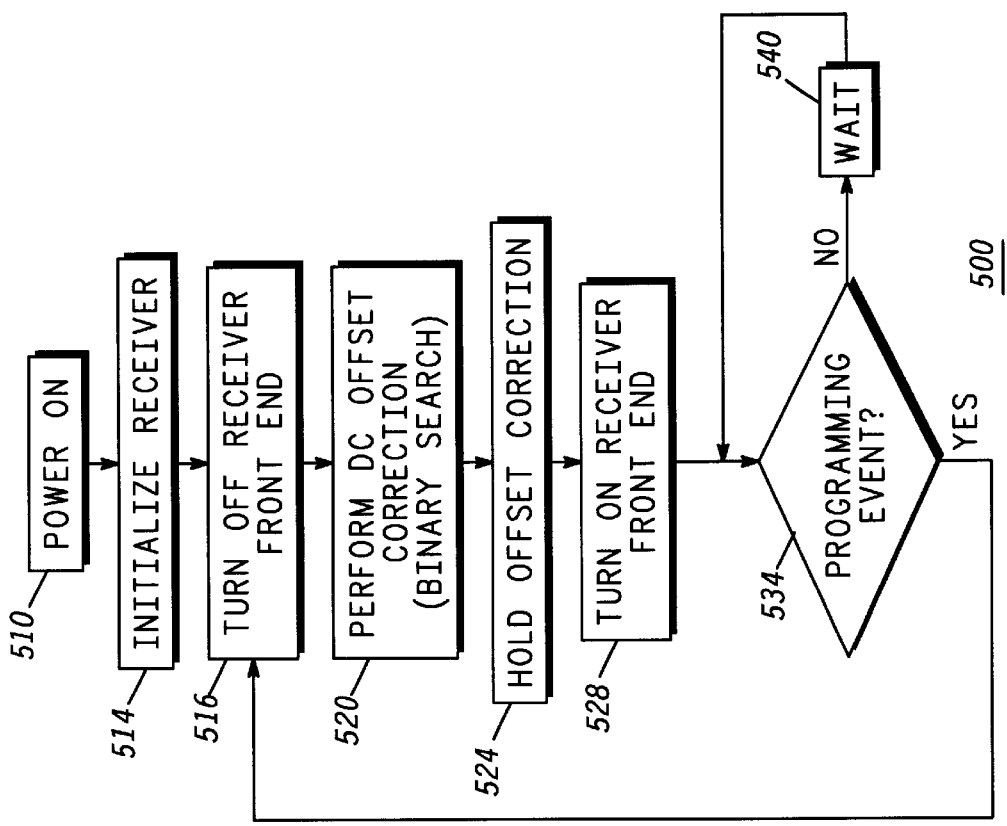
FIG. 5 is a flow chart showing an overall process for DC offset correction in accordance with embodiments of the present invention.

Referring now to FIG. 5, an overall process 500 for initiating and maintaining DC offset correction in the context of a radio receiver is shown. In this process, the radio receiver is turned on at 510. Modern radio receivers are commonly controlled by a microcomputer, microcontroller and/or a digital signal processor as represented by controller 250 (FIG. 2). At 514, the operational parameters of the receiver are initialized. The offset correction begins at 516 where the receiver front end and the signal path are associated therewith is disabled by, for example, turning off a local injection oscillator or reducing the gain of an RF and/or IF amplifier to remove RF or IF signal from the DC offset correction loop. As an alternative to disabling the receiver front end at 516, it is possible to take no action in a system wherein it can be guaranteed that there will be no RF input to the receiver during the offset correction process.

Offset correction is carried out at 520, for example, as described earlier herein. Preferably, this process is carried out using the binary search process described earlier under the control of controller 250. However, the invention should not be so limited since other offset correction processes could equivalently be substituted according to this aspect of the invention.

Once the DC offset correction value is determined at 516, this value is added to the DC offset of the receiver to compensate for the DC offset as previously described. This value is set and held at 524. The receiver front end is then enabled at 528 to begin receiver operation. This value is held until a programming event occurs which indicates to the receiver's controller 250 that a new correction cycle should be initiated. This is indicated at 534 as a determination that a programming event has occurred. If such event has not occurred, the process waits at 540 and then reevaluates if the programming event has occurred at 534. This cycle repeats until a programming event occurs, at which point the process starting at 516 repeats to establish an updated DC offset correction value.

It should be noted that although the present invention, in its various aspects and embodiments are described in terms of DC offset correction in a radio receiver, similar techniques could be used in a radio transmitter without departing from the present invention.

Several types of programming events can be used to trigger a new DC offset correction cycle. The preferred method, in the context of a DC offset correction loop used in a Zero IF radio receiver, is for the controller 250 to monitor the DC offset presented by the receiver. When this offset exceeds a predetermined threshold, the binary search is then scheduled and executed. This embodiment has several advantages: 1) The binary search is only performed on an as needed basis. Thus, if a radio is kept at nearly constant operating conditions, there will be no need to perform a binary search. 2) If for some reason a binary search results in an erroneous offset correction, it will be quickly detected and a new offset correction will be scheduled almost immediately, e.g., within a few milliseconds.

In another embodiment an offset correction cycle can be scheduled at predetermined times. In a radio receiver environment wherein the receiver operates in synchronization with a predetermined frame rate, the timing for a new offset correction cycle can be synchronized with the frame rate.

A third embodiment involves monitoring a physical parameter such as temperature, atmospheric pressure, supply voltage and/or humidity periodically and initiating a new DC offset correction cycle based on the worst case DC offset gradient for the parameter being measured. By way of example, and not limitation, if it is known that the DC offset changes by 10 millivolts per degree Celsius, and it is desired to maintain DC offset at less than 100 millivolts; then, a programming event suitable for triggering a new DC offset correction cycle includes detecting a change of 10 degrees Celsius in temperature.

Temperature can be monitored, for example, by a dedicated temperature sensing device. Alternatively, some receivers include a temperature sensor used for sensing temperature to adjust various parameters in a radio, for example, for adjusting an automatic frequency control. So, for example, if the temperature changes by a predetermined number of degrees, a DC offset correction cycle can be initiated. Or, if the temperature changes by a predetermined amount depending upon the temperature when the last DC offset correction cycle occurred, then a new cycle is initiated. Several variations can be devised depending upon the DC offset characteristics over temperature of the particular radio receiver. This embodiment also may result in extra executions of the DC offset correction, but should generally result in fewer than in the second embodiment above.

In yet another embodiment, time can simply be monitored and a DC offset correction cycle initiated when a predetermined time period has lapsed, e.g. every hour. The controller 250 in many receivers keeps track of time and this can be used to trigger a new DC offset correction cycle. The controller 250 can increment a timer, for example, and schedule an offset correction.

Those of ordinary skill in the art will appreciate that other programming events can possibly be used to trigger the onset of a new DC offset correction cycle. Moreover, according to this aspect of the invention, other types of offset correction than the binary search method described could also be used.

The DC offset correction of the present invention can be used in many environments including both analog and digital radio receivers and transmitters. Several advantages including fast settling time, and reduced die area are achieved using the DC offset correction loop of the present invention. Traditional analog DC offset correction loops utilize large capacitors necessitating additional pinouts from the integrated circuit. The DC offset correction loop of the present invention eliminates the need for such capacitors, and accordingly, the extra pin-outs are eliminated as well. Furthermore, the system can digitally hold the correction value thereby providing the advantage of eliminating the high pass response associated with traditional integrator approaches. Digital storing of the correction value also avoids the capacitor leakage problems associated with trying to hold the correction value in the traditional analog system. Direct conversion receivers and zero IF receivers as well as other applications will benefit from the advantages of this correction loop.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of correcting a DC offset in a radio receiver, comprising:
   disabling a front end of the radio receiver to disrupt receipt of radio signals;
   performing a DC offset correction process to determine a DC compensation value;
   holding the DC compensation value to compensate for the receiver's DC offset;
   enabling the receiver's front end;
   determining that a programming event has occurred; and
   repeating the disabling, performing, holding and enabling to update the DC compensation value.

2. A method in accordance with claim 1, wherein the programming event comprises comparing the DC offset value to a threshold, and wherein the repeating comprises repeating the disabling, performing, holding and enabling to update the DC compensation value in the event the DC offset value exceeds the threshold.

3. A method in accordance with claim 1, wherein the programming event comprises determining that a change has occurred in a power supply voltage; and wherein the repeating comprises repeating the disabling, performing, holding and enabling to update the DC compensation value.

4. A method in accordance with claim 1, wherein the programming event comprises determining that a change has occurred in a humidity; and wherein the repeating comprises repeating the disabling, performing, holding and enabling to update the DC compensation value.

5. A method in accordance with claim 1, wherein the programming event comprises determining that a change has occurred in a temperature; and wherein the repeating comprises repeating the disabling, performing, holding and enabling to update the DC compensation value.

6. A method in accordance with claim 1, wherein the programming event comprises determining that a change has occurred in an atmospheric pressure; and wherein the repeating comprises repeating the disabling, performing, holding and enabling to update the DC compensation value.

7. A method in accordance with claim 1, wherein the programming event comprises expiration of a predetermined period of time, and wherein the repeating comprises repeating the disabling, performing, holding and enabling to update the DC compensation value after expiration of the predetermined period of time.

8. A method in accordance with claim 1, wherein the disabling and enabling are carried out by disabling a receiver low noise amplifier.

9. A method in accordance with claim 1, wherein the disabling and enabling are carried out by disabling a receive injection oscillator.

10. A DC offset correction system, comprising:
    a gain stage having an input with a DC offset and an output having an amplified DC offset;
    a feedback loop coupled between the input and the output of the gain stage, the feedback loop including a source of DC offset correction voltage which can be set to a correction value and held at that correction value; and
    a controller which instructs the source of DC offset correction voltage to set and hold a correction value, and the controller monitors a programming event and initiates an offset correction cycle to set a new correction value when the programming event occurs.

11. A system in accordance with claim 10, wherein the programming event comprises comparing the DC offset value to a threshold.

12. A system in accordance with claim 10, wherein the programming event comprises determining that a change has occurred in a power supply voltage.

13. A system in accordance with claim 10, wherein the programming event comprises determining that a change has occurred in one or more of a humidity, a temperature and an atmospheric pressure.

14. A system in accordance with claim 10, wherein the programming event comprises expiration of a predetermined period of time.

15. A system in accordance with claim 10, wherein the gain stage and the feedback loop form a portion of a radio receiver.

16. A system in accordance with claim 10, wherein the gain stage and the feedback loop form a portion of a radio transmitter.

17. A method of correcting DC offset, comprising:
    performing an initial DC offset correction by determining a DC correction value and holding the DC correction value;
    determining that a programming event has occurred suggesting that the DC correction value is no longer adequately correcting DC offset; and
    responsive to the determining, repeating the performing to obtain a revised DC correction value and holding the DC correction value.

18. A method in accordance with claim 17, wherein the programming event comprises a change in at least one of the following parameters: DC offset, power supply voltage, time, temperature, humidity and pressure.

19. A method in accordance with claim 18, wherein the parameters are parameters of a radio receiver.

20. A method in accordance with claim 18, wherein the parameters are parameters of a radio transmitter.

* * * * *